(12) United States Patent
Furuie

(10) Patent No.: US 11,616,211 B2
(45) Date of Patent: Mar. 28, 2023

(54) DISPLAY DEVICE

(71) Applicant: Japan Display Inc., Tokyo (JP)

(72) Inventor: Masamitsu Furuie, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/178,751

(22) Filed: Feb. 18, 2021

(65) Prior Publication Data

US 2021/0184170 A1 Jun. 17, 2021

Related U.S. Application Data

(63) Continuation of application No. 16/925,844, filed on Jul. 10, 2020, now Pat. No. 10,991,912, which is a
(Continued)

(30) Foreign Application Priority Data

Jan. 6, 2016 (JP) ................................ 2016-001317

(51) Int. Cl.
*H01L 51/52* (2006.01)
*H01L 51/50* (2006.01)
(Continued)

(52) U.S. Cl.
CPC ...... *H01L 51/5253* (2013.01); *H01L 27/3258* (2013.01); *H01L 51/5012* (2013.01);
(Continued)

(58) Field of Classification Search
CPC .............. H01L 51/5253; H01L 51/5237; H01L 51/5259
See application file for complete search history.

(56) References Cited

U.S. PATENT DOCUMENTS 9,128,331 B2 9/2015 Mori
9,372,366 B2 6/2016 Mori
(Continued)

FOREIGN PATENT DOCUMENTS

JP 2004-335267 11/2004
JP 2005-158292 6/2005
(Continued)

OTHER PUBLICATIONS

Combined Office Action and Search Report dated Jan. 4, 2019 in Chinese Patent Application No. 201611027705.8 with English translation of the Office Action and English translation of categories of cited documents.
(Continued)

*Primary Examiner* — Victoria K. Hall
(74) *Attorney, Agent, or Firm* — Maier & Maier, PLLC

(57) ABSTRACT

A display device, which includes a display region in which a plurality of pixels are arranged, includes a first organic insulating film, a first groove, which exists in a frame shape surrounding the display region to separate the first organic insulating film, a first inorganic partition portion, which is arranged in the first groove, and is made of an inorganic insulating material that exists in a frame shape surrounding the display region, a second organic insulating film formed above the first organic insulating film and the first inorganic partition portion, and a second groove, which exists in a frame shape surrounding the display region to separate the second organic insulating film, and is located inside the first groove in plan view.

18 Claims, 13 Drawing Sheets

Related U.S. Application Data continuation of application No. 16/166,845, filed on Oct. 22, 2018, now Pat. No. 10,756,299, which is a continuation of application No. 15/863,204, filed on Jan. 5, 2018, now Pat. No. 10,141,542, which is a continuation of application No. 15/343,922, filed on Nov. 4, 2016, now Pat. No. 9,893,316.

(51) Int. Cl.
  *H01L 51/56* (2006.01)
  *H01L 27/32* (2006.01)

(52) U.S. Cl.
  CPC ...... *H01L 51/5206* (2013.01); *H01L 51/5221* (2013.01); *H01L 51/5246* (2013.01); *H01L 51/56* (2013.01); H01L 27/3276 (2013.01); H01L 51/5203 (2013.01); H01L 51/5237 (2013.01); H01L 51/5259 (2013.01); H01L 2251/5338 (2013.01)

(56) References Cited

U.S. PATENT DOCUMENTS

| | | | |
|---|---|---|---|
| 9,484,550 B2 | 11/2016 | Furuie | |
| 9,583,550 B2* | 2/2017 | Tada | H01L 27/3279 |
| 9,793,513 B2 | 10/2017 | Furuie | |
| 9,847,508 B2* | 12/2017 | Furuie | H01L 51/5246 |
| 9,893,316 B2* | 2/2018 | Furuie | H01L 51/5253 |
| 9,929,371 B2 | 3/2018 | Hanari | |
| 9,929,378 B2 | 3/2018 | Kokame | |
| 10,003,045 B2 | 6/2018 | Suzuki | |
| 10,128,463 B2* | 11/2018 | Furuie | H01L 51/5253 |
| 10,141,539 B2 | 11/2018 | Suzuki | |
| 10,141,542 B2* | 11/2018 | Furuie | H01L 51/5012 |
| 10,263,200 B2* | 4/2019 | Odaka | H01L 51/0097 |
| 10,355,238 B2 | 7/2019 | Suzuki | |
| 10,454,063 B2 | 10/2019 | Chang | |
| 10,559,772 B2 | 2/2020 | Ochi | |
| 10,573,845 B2 | 2/2020 | Suzuki | |
| 10,600,854 B2 | 3/2020 | Kim | |
| 10,608,062 B2 | 3/2020 | Takahashi | |
| 10,636,996 B2 | 4/2020 | Yasuda | |
| 10,673,011 B2 | 6/2020 | Tsuchiya | |
| 10,680,197 B2 | 6/2020 | Miura | |
| 10,727,424 B2 | 7/2020 | Tanaka | |
| 10,756,279 B2* | 8/2020 | Odaka | H01L 51/0097 |
| 10,756,299 B2* | 8/2020 | Furuie | H01L 51/5246 |
| 10,923,679 B2* | 2/2021 | Furuie | H01L 27/3246 |
| 10,991,907 B2* | 4/2021 | Suzuki | H01L 51/5253 |
| 10,991,912 B2* | 4/2021 | Furuie | H01L 51/5221 |
| 11,545,541 B2* | 1/2023 | Okabe | H01L 51/56 |
| 2004/0263740 A1 | 12/2004 | Sakakura | |
| 2005/0023964 A1 | 2/2005 | Omura et al. | |
| 2009/0001895 A1 | 1/2009 | Kim | |
| 2014/0203260 A1 | 7/2014 | Ookawara | |
| 2014/0291641 A1 | 10/2014 | Negishi | |
| 2015/0008406 A1* | 1/2015 | Furuie | H01L 51/5253 438/26 |
| 2015/0060823 A1 | 3/2015 | Furuie | |
| 2015/0207100 A1 | 7/2015 | Saito | |
| 2015/0331265 A1 | 11/2015 | Mori | |
| 2016/0079564 A1 | 3/2016 | Shim | |
| 2016/0104757 A1 | 4/2016 | Kim | |
| 2016/0204373 A1 | 7/2016 | Park | |
| 2016/0223876 A1 | 8/2016 | Yamamoto | |
| 2016/0380040 A1 | 12/2016 | Tada | |
| 2017/0122431 A1 | 1/2017 | Suzuki | |
| 2017/0033162 A1 | 2/2017 | Rohatgi | |
| 2017/0062479 A1 | 3/2017 | Shinokawa | |
| 2017/0133594 A1 | 5/2017 | Mimura | |
| 2017/0133628 A1 | 5/2017 | Furuie | |
| 2017/0148856 A1 | 5/2017 | Choi | |
| 2017/0184899 A1 | 6/2017 | Saeki | |
| 2017/0194601 A1 | 7/2017 | Kokame | |
| 2017/0244063 A1 | 8/2017 | Furuie | |
| 2018/0151834 A1* | 5/2018 | Kanaya | H01L 27/3258 |
| 2020/0006702 A1 | 1/2020 | Sonoda | |
| 2020/0043997 A1* | 2/2020 | Sonoda | H01L 51/56 |
| 2020/0067017 A1 | 2/2020 | Seo | |
| 2020/0266352 A1 | 8/2020 | Kubota | |
| 2020/0388668 A1 | 12/2020 | Okabe | |

FOREIGN PATENT DOCUMENTS

| | | |
|---|---|---|
| JP | 2010-48837 | 3/2010 |
| JP | 2014-199739 | 10/2014 |
| KR | 10-2006-0050422 | 5/2006 |

OTHER PUBLICATIONS

Office Action dated Feb. 12, 2018 in Korean Patent Application No. 10-2016-0144977 with English translation, 14 pages.

Office Action dated Aug. 13, 2018, in Korean Patent Application No. 10-2016-0144977 (with English-language translation).

Machine translation, Fuchigama, Japanese Pat. Pub. No. JP 2005-158292, translation date: Jun. 22, 2018, Espacenet, all pages.

* cited by examiner

DISPLAY DEVICE

CROSS-REFERENCE TO RELATED APPLICATION

The present application is a Continuation of U.S. application Ser. No. 16/925,844 filed Jul. 10, 2020 (now U.S. Pat. No. 10,991,912, issued Apr. 27, 2021), which is a Continuation of U.S. application Ser. No. 16/166,845 filed Oct. 22, 2018 (now U.S. Pat. No. 10,756,299, issued Aug. 25, 2020), which is a Continuation of U.S. application Ser. No. 15/863,204 filed Jan. 5, 2018 (now U.S. Pat. No. 10,141,542, issued Nov. 27, 2018), which is a Continuation of U.S. application Ser. No. 15/343,922 filed Nov. 4, 2016 (now U.S. Pat. No. 9,893,316, issued Feb. 13, 2018), and claims priority from Japanese application JP 2016-001317 filed on Jan. 6, 2016, the content of each of which is hereby incorporated by reference into this application.

BACKGROUND OF THE INVENTION

1. Field of the Invention

The present invention relates to a display device and a method of manufacturing the display device.

2. Description of the Related Art

In Japanese Patent Application Laid-open No. 2005-158292, it is disclosed that a pixel electrode is arranged on a planarization insulating film containing an organic material, that an aperture portion is formed in an element isolation film, which covers the planarization insulating film and the pixel electrode, to expose the pixel electrode, and that the element isolation film may contain an organic material.

SUMMARY OF THE INVENTION

Meanwhile, in a display device including an organic insulating film, as disclosed in Japanese Patent Application Laid-open No. 2004-335267, there are cases where a separation groove, which is configured to block moisture intrusion, is formed between a display region and an edge.

When such separation groove is to be applied to the display device including the two-layer organic insulating film as in Japanese Patent Application Laid-open No. 2005-158292, there can be conceived a method in which a first separation groove is formed in the lower organic insulating film, then the upper organic insulating film is formed, and a second separation groove is formed in a portion to fill the first separation groove. However, when the upper organic insulating film is formed by application, the portion to fill the first separation groove becomes thicker than a portion above the lower organic insulating film. Therefore, under etching conditions optimized to form the aperture to expose the pixel electrode, the portion to fill the first separation groove cannot be fully separated by the second separation groove. As a result, a remaining film of the upper organic insulating film serves as a moisture intrusion path, and there is a risk that a sufficient moisture blocking property cannot be obtained. Moreover, under etching conditions optimized so that no remaining film of the upper organic insulating film is generated, the lower organic insulating film is excessively etched, and there is a risk that a pattern defect may be generated.

The present invention has been made in view of the above-mentioned problems, and therefore has an object to provide a display device, which is capable of preventing degradation of elements in a light emitting layer due to moisture intrusion to a display portion by improving a moisture blocking property, and a method of manufacturing the display device.

A display device, which includes a display region in which a plurality of pixels are arranged, includes a first organic insulating film, a first groove, which exists in a frame shape surrounding the display region to separate the first organic insulating film, a first inorganic partition portion, which is arranged in the first groove, and is made of an inorganic insulating material that exists in a frame shape surrounding the display region, a second organic insulating film formed above the first organic insulating film and the first inorganic partition portion, and a second groove, which exists in a frame shape surrounding the display region to separate the second organic insulating film, and is located inside the first groove in plan view.

A method of manufacturing a display device, which includes a display region in which a plurality of pixels are arranged, the method includes forming a first inorganic partition portion, which is made of an inorganic insulating material that exists in a frame shape surrounding the display region, forming a first organic insulating film having a first groove, in which the first inorganic partition portion is arranged, forming a second organic insulating film above the first organic insulating film in a state in which the first inorganic partition portion is arranged in the first groove, and forming a second groove, which exists in a frame shape surrounding the display region to separate the second organic insulating film, and is located inside the first groove in plan view.

DETAILED DESCRIPTION OF THE INVENTION

Now, embodiments of the present invention are described with reference to the drawings. The disclosure in this specification is merely an example of the present invention, and appropriate changes that can be easily conceived by those skilled in the art without departing from the main gist of the invention are encompassed by the scope of the invention. Moreover, widths, thicknesses, shapes, and the like of the respective parts illustrated in the figures may be schematically illustrated in some cases, and are not to limit the interpretation of the invention. Moreover, in the specification and the figures, elements like those described above with reference to figures that have been already described are denoted by like reference symbols, and detailed description thereof may be omitted as appropriate.

As an example of a display device, an organic electro luminescence (EL) display device using organic light-emitting diodes (OLEDs), which are a type of self-light-emitting elements, is described below.

First Embodiment

Figure 1:
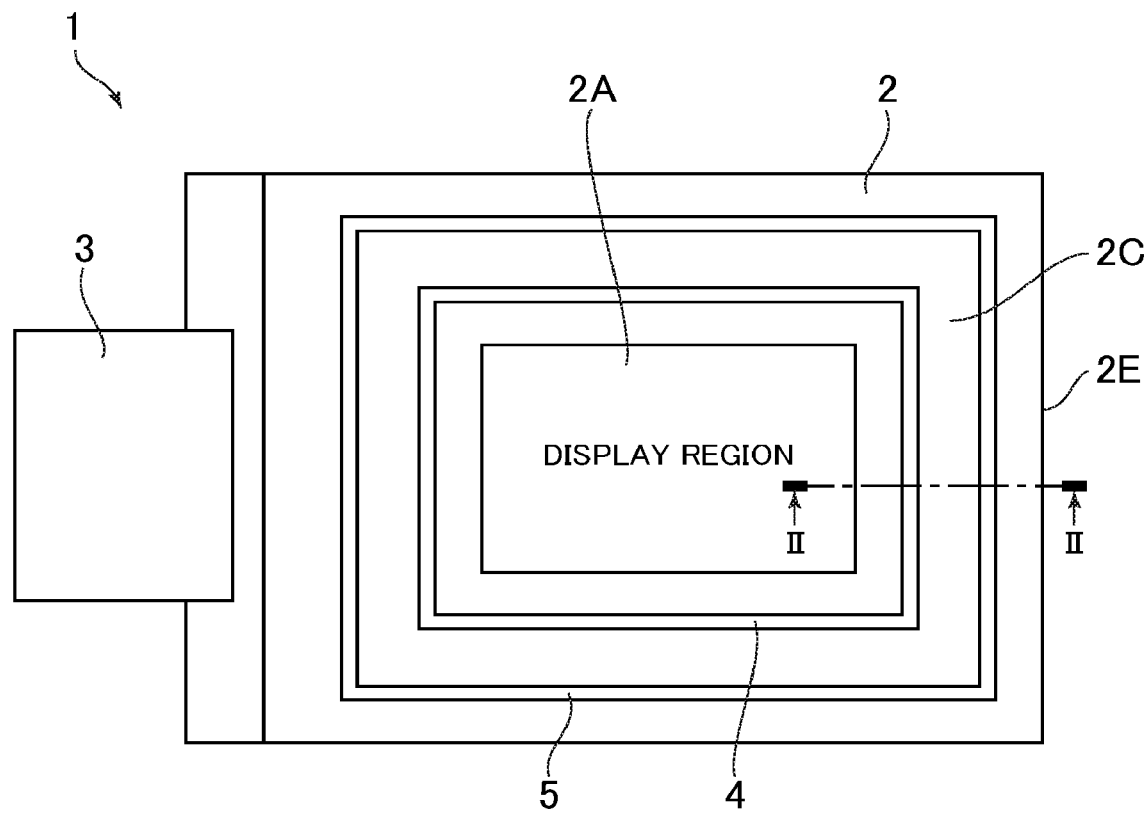
FIG. 1 is a plan view of a display device according to a first embodiment of the present invention.
Figure 2:
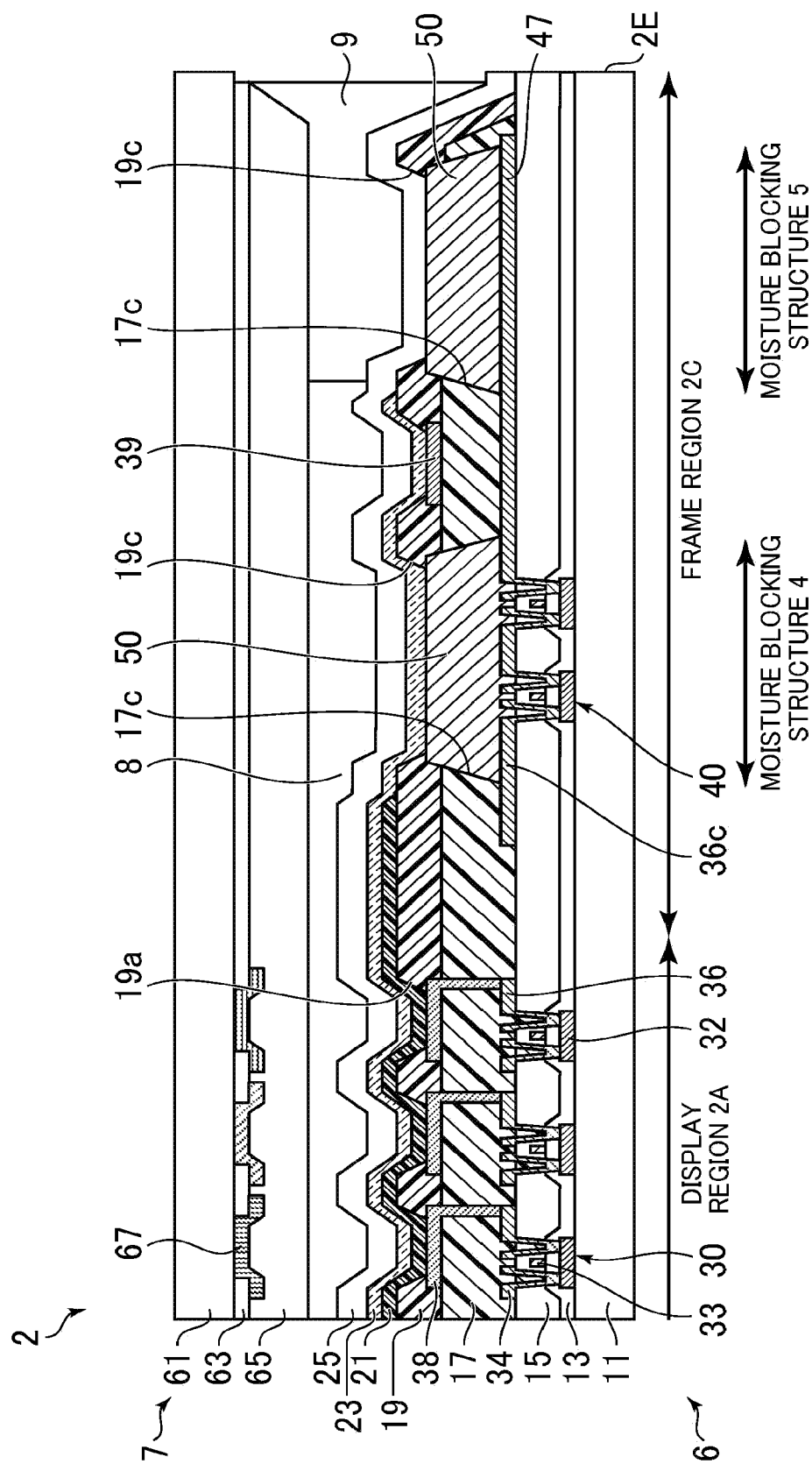
FIG. 2 is a sectional view of the above-mentioned display device.

FIG. 1 is a plan view of a display device 1 according to a first embodiment of the present invention. FIG. 2 is a sectional view taken along the line II-II of FIG. 1. The display device 1 includes a display panel 2, and a flexible printed circuit (FPC) 3 mounted to an end portion of the display panel 2. In a center portion of the display panel 2, a rectangular display region 2A, in which a plurality of pixels are arranged in matrix, is provided. It is preferred that the plurality of pixels are classified into a plurality of colors of emitted light, and examples of the colors of emitted light of the pixels include three colors: red, green, and blue, or four colors: red, green, blue, and white. Cyan, magenta, and yellow may be included as the colors of emitted light of the pixels.

A frame region 2C having a frame shape is provided to surround the display region 2A. In the frame region 2C, a plurality of moisture blocking structures 4 and 5 are provided to suppress moisture intrusion from an edge 2E of the display panel 2 to the display region 2A. The moisture blocking structures 4 and 5 are located between the edge 2E of the display panel 2 and the display region 2A, and are formed into frame shapes to surround the display region 2A. In the example illustrated in the figures, two moisture blocking structures 4 and 5 are arranged in a direction from the edge 2E to the display region 2A (this direction is hereinafter referred to as "direction of moisture intrusion"). However, the present invention is not limited thereto, and may include only one moisture blocking structure. Moreover, in the example illustrated in the figures, each of the moisture blocking structures 4 and 5 surrounds the display region 2A without any interruption. However, the present invention is not limited thereto, and when another inorganic insulating material and other such structures exist inside the frame, the moisture blocking structure may be interrupted in the midway.

Figure 12:
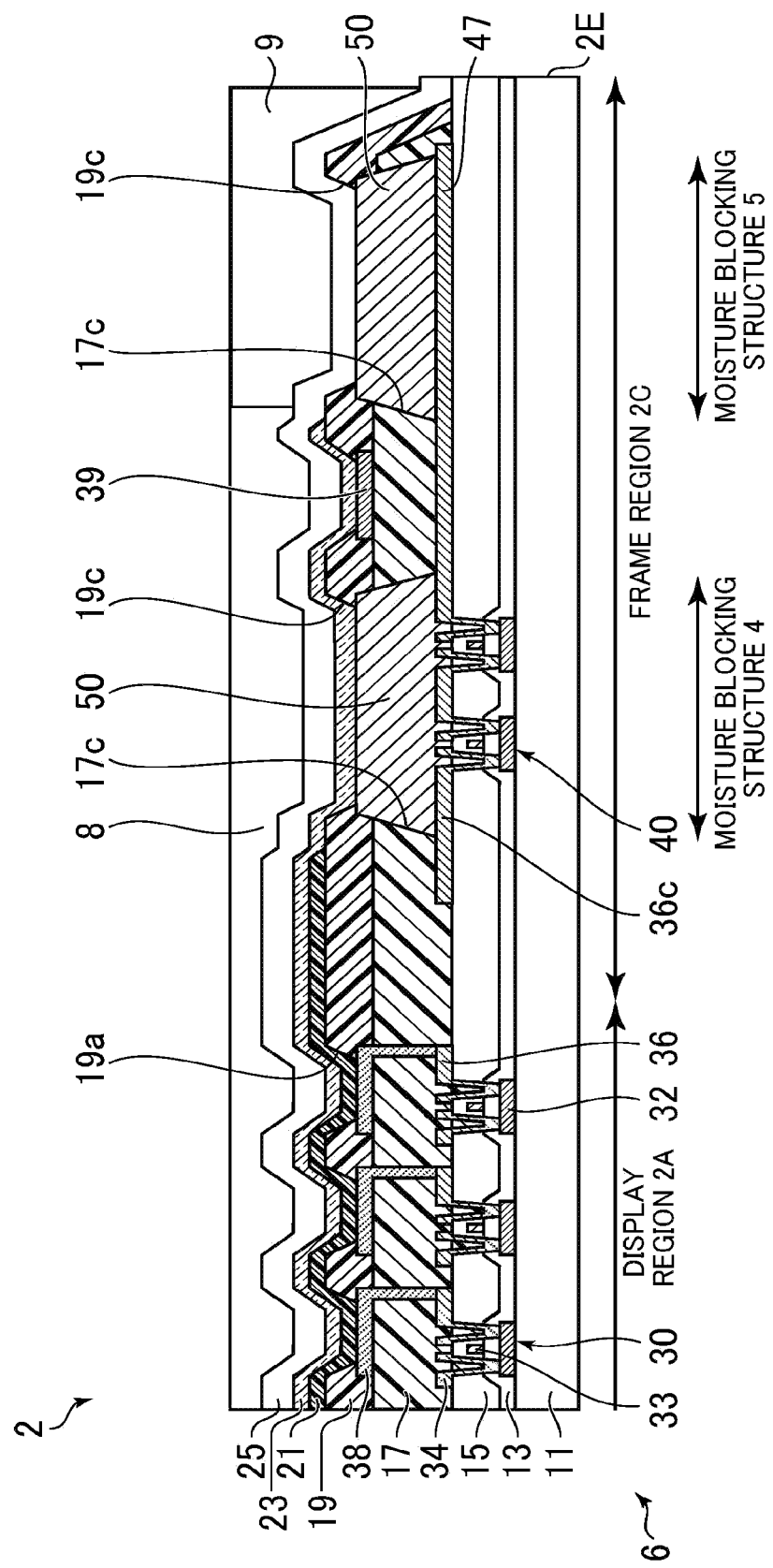
FIG. 12 is a sectional view of a display device according to a modified example of the present invention.

The display panel 2 includes an array substrate 6, and an opposing substrate 7, which is opposed to the array substrate 6. As illustrated in FIG. 12, the opposing substrate 7 may not be provided. The array substrate 6 and the opposing substrate 7 are bonded to each other via a filler 8. Specifically, a frame-shaped sealing member 9 is provided along the edge 2E of the display panel 2, and the filler 8 is filled in a space inside the sealing member 9. The display panel 2 is, for example, of a top emission type in which light is emitted in a direction of the opposing substrate 7 (this direction is hereinafter referred to as "above", and a direction opposite to the direction is hereinafter referred to as "below") with reference to the array substrate 6.

The opposing substrate 7 includes a substrate 61 made of glass, for example. The substrate 61 may be made of a flexible resin, e.g., polyimide, instead. When the display pane 12 is of the top emission type, the substrate 61 is transparent. On the side of the substrate 61 that faces the array substrate 6, there are provided a black matrix (BM) 63 in which apertures are formed to correspond to light emitting regions of the respective pixels, a color filter 67 formed to partially overlap the BM 63, and a planarization layer 65 covering the BM 63 and the color filter 67. The color filter 67 may be provided in the array substrate 6 instead. The planarization layer 65 may not be provided.

The array substrate 6 includes a substrate 11 made of glass, for example. The substrate 11 may be made of a flexible resin, e.g., polyimide, instead. When the display panel 2 is of the top emission type, the substrate 11 does not need to be transparent. On a side of the substrate 11 that faces the opposing substrate 7, pixel circuits 30 corresponding to the respective pixels and the like are provided in the display region 2A, and the moisture blocking structures 4 and 5 and the like are provided in the frame region 2C. The pixel circuits 30 include thin film transistors (TFTs), and are arranged to correspond to the respective pixels.

In the display region 2A, a semiconductor film 32 is provided above the substrate 11. The substrate 11 and the semiconductor film 32 are covered by an interlayer insulating film 13, and gate electrodes 33 are arranged above the interlayer insulating film 13. The interlayer insulating film 13 and the gate electrodes 33 are covered by an interlayer insulating film 15, and source electrodes 34 and drain electrodes 36 are arranged above the interlayer insulating film 15. Interlayer connection holes for connecting the source electrodes 34 and the drain electrodes 36 to the semiconductor film 32 are formed in the interlayer insulating films 13 and 15. The semiconductor film 32, gate electrode 33, source electrode 34, and drain electrode 36 form a TFT of the pixel circuit 30. The gate electrode 33 is connected to a drain electrode of another TFT (not shown), and a power line (not shown) is connected to the source electrode 34. The semiconductor film 32 includes, for example, an LTPS semiconductor, an amorphous semiconductor, and an oxide semiconductor. The interlayer insulating films 13 and 15 are inorganic insulating films each made of an inorganic material, e.g., silicon oxide or silicon nitride. The gate electrode 33, the source electrode 34, and the drain electrode 36 are each made of a metal, e.g., aluminum, silver, copper, nickel, or titanium.

Figure 11:
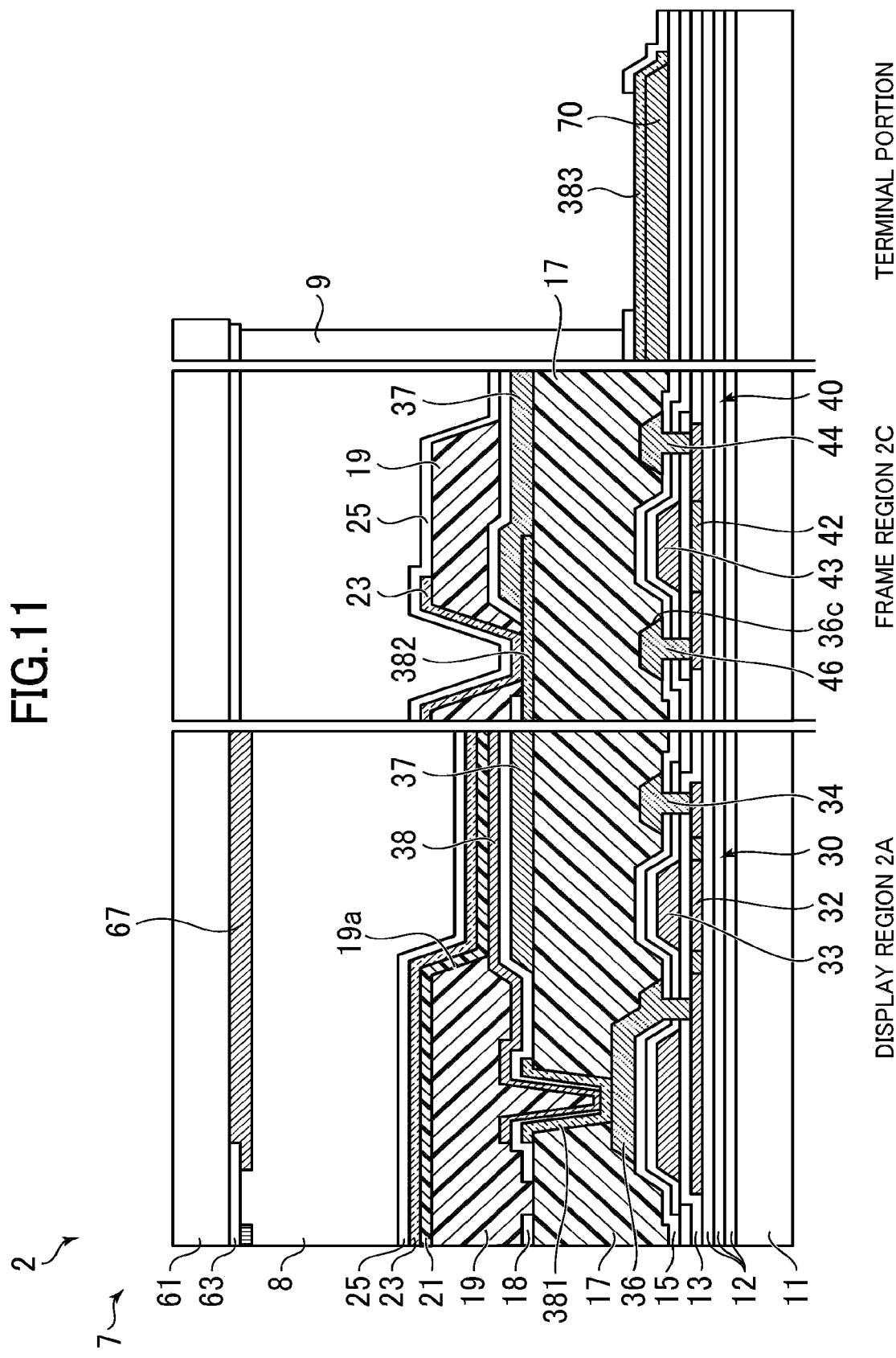
FIG. 11 is a sectional view of a display device according to a modified example of the present invention.

In the example illustrated in the figure, the semiconductor film 32 is in contact with the substrate 11. However, the present invention is not limited thereto, and one or a plurality of undercoat layers 12 as illustrated in FIG. 11 may be interposed between the substrate 11 and the semiconductor film 32. The undercoat layers 12 are inorganic insulating films each made of an inorganic material, e.g., silicon oxide or silicon nitride.

The interlayer insulating film 15, the source electrodes 34, and the drain electrodes 36 are covered by an organic planarization film 17, and pixel electrodes 38 are arranged above the organic planarization film 17. Interlayer connection holes are formed in the organic planarization film 17 to connect the pixel electrodes 38 to the drain electrodes 36. The organic planarization film 17 is an example of a first organic insulating film, and is an organic insulating film containing an organic material, e.g., an acrylic resin. The organic planarization film 17 is formed to be thicker than the other interlayer insulating films, and has a planar upper surface. The pixel electrodes 38 are anodes, for example, and are arranged to correspond to the respective pixels. The pixel electrodes 38 are each made of a metal, e.g., indium tin oxide (ITO), aluminum, silver, copper, nickel, or titanium, and may include a reflection surface.

The organic planarization film 17 and the pixel electrodes 38 are covered by a pixel isolation film 19, and apertures 19a are formed in the pixel isolation film 19 to expose the pixel electrodes 38 excluding ends thereof. Specifically, the pixel isolation film 19 covers the ends of the pixel electrodes 38, and the pixel electrodes 38 are exposed in the other regions. Inner edge portions forming the apertures 19a of the pixel isolation film 19 have a mildly tapered shape. The pixel isolation film 19 is an example of a second organic insulating film, and is an organic insulating film containing an organic material, e.g., an acrylic resin. The pixel isolation film 19 is also called as banks or ribs.

The pixel isolation film 19 and the pixel electrodes 38 exposed in the apertures 19a are covered by an organic film 21 containing a light emitting layer. The organic film 21 includes, in order from the pixel electrode 38 side, a hole injection layer, a hole transport layer, a light emitting layer, an electron transport layer, and an electron injection layer, for example. The laminate structure of the organic film 21 is not limited thereto, and is not particularly limited as long as at least the light emitting layer is included. In this embodiment, a color of emitted light of the light emitting layer included in the organic film 21 is white. However, the present invention is not limited thereto, and the color may be another color. The organic film 21 is formed by vapor deposition using no mask, for example, and is formed in a range including the display region 2A to the front of the moisture blocking structure 4 on the inside.

The organic film 21 is covered by a counter electrode 23. The counter electrode 23 is a cathode, for example, and is formed to cover the entire organic film 21. The counter electrode 23 is made of a transparent conductive material, e.g., indium tin oxide (ITO) or indium zinc oxide (IZO). The counter electrode 23 is formed in a range that covers the organic film 21, for example, to between the moisture blocking structure 4 on the inside and the moisture blocking structure 5 on the outside. Further, the counter electrode 23 is covered by a sealing film 25. The sealing film 25 is an inorganic insulating film made of an inorganic material, e.g., silicon oxide or silicon nitride, and is formed over the entire array substrate 6. The sealing film 25 is in contact with the filler 8 and the sealing member 9.

In the frame region 2C, the moisture blocking structures 4 and 5, which separate each of the organic planarization film 17 and the pixel isolation film 19, are provided. First separation grooves 17c, which separate the organic planarization film 17, are formed in the moisture blocking structures 4 and 5, and an inorganic partition portion 50 is arranged in the first separation groove 17c. The first separation grooves 17c and the inorganic partition portion 50 separate the organic planarization film 17. The inorganic partition portion 50 is made of an inorganic insulating material, e.g., silicon oxide or silicon nitride. The inorganic insulating material does not allow moisture to pass therethrough, and is not eroded as opposed to a metal. Therefore, the inorganic insulating material is optimal as a structure for blocking moisture. The inorganic partition portion 50 has, for example, a trapezoid sectional shape, which has an upper surface and is increased in width toward the bottom. To the contrary, the first separation groove 17c has an overhang shape in which a width on the upper side is smaller than a width on the lower side. The upper surface of the inorganic partition portion 50 is located above an upper surface of the organic planarization film 17, and is at about the same height as upper surfaces of the pixel electrodes 38, for example.

Second separation grooves 19c are also formed in the moisture blocking structures 4 and 5 to separate the pixel isolation film 19. The second separation groove 19c is formed to be contained inside the first separation groove 17c in plan view. For example, a lower aperture of the second separation groove 19c may be contained inside an upper aperture of the first separation groove 17c in plan view. The second separation groove 19c does not always need be formed to be contained inside the first separation groove 17c as long as the second separation groove 19c overlaps the first separation groove 17c in plan view. The second separation groove 19c has its bottom at the upper surface of the inorganic partition portion 50, and is formed so that a lower aperture of the second separation groove 19c is contained in the upper surface of the inorganic partition portion 50, for example. An edge portion that forms the second separation groove 19c of the pixel isolation film 19 is in contact with an upper corner portion of the inorganic partition portion 50.

Figure 13:
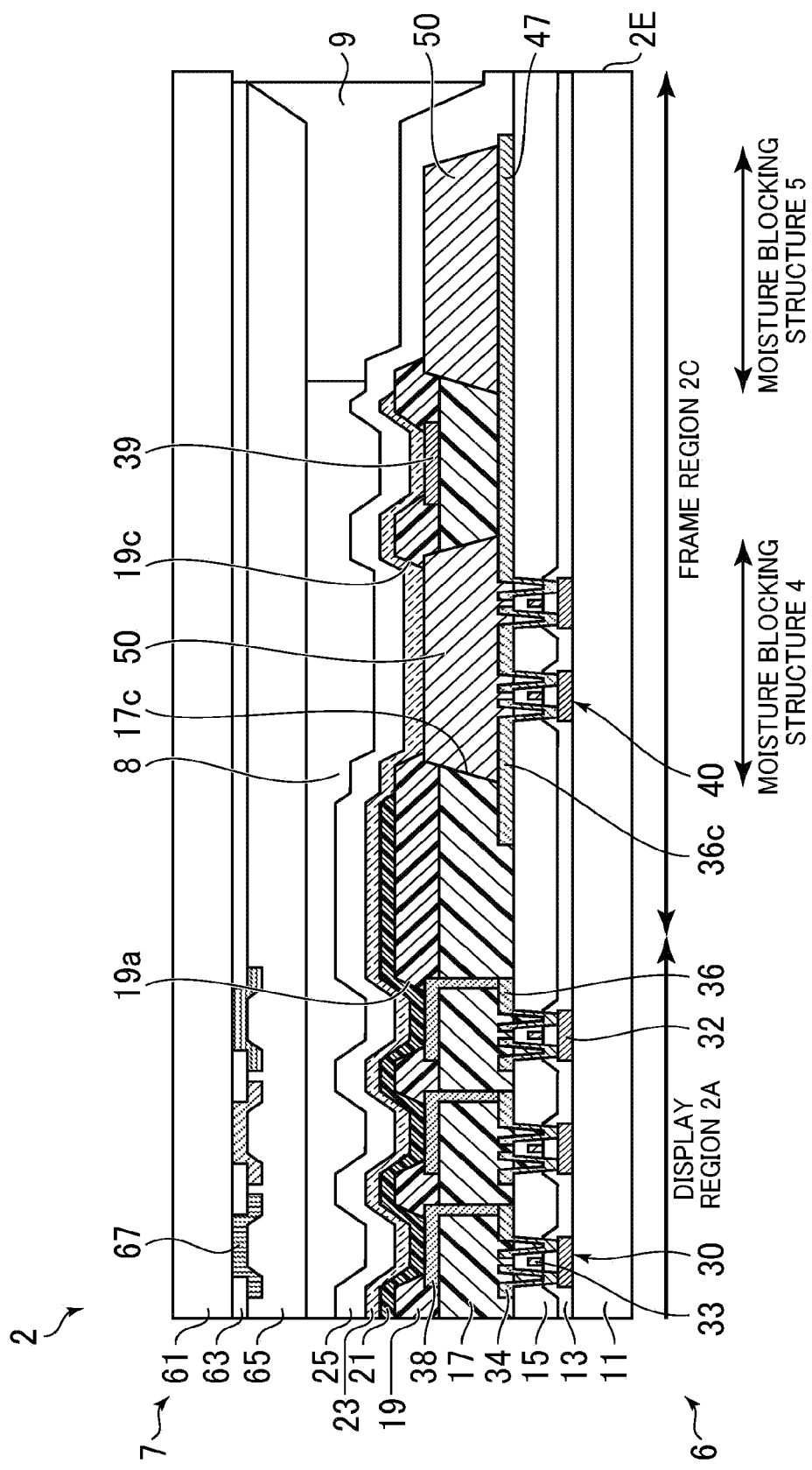
FIG. 13 is a sectional view of a display device according to a modified example of the present invention.

The counter electrode 23 and the sealing film 25 are further laminated above the inorganic partition portion 50 of the moisture blocking structure 4 on the inside, and the sealing film 25 is further laminated above the inorganic partition portion 50 of the moisture blocking structure 5 on the outside. A conductive film 39 in the same layer as the pixel electrodes 38 is formed between the moisture blocking structure 4 on the inside and the moisture blocking structure 5 on the outside, and the counter electrode 23 is connected to the conductive film 39 via apertures formed in the pixel isolation film 19. In this embodiment, an organic layer exists between the moisture blocking structure 5 and the edge 2E, but a structure without the organic layer may be adopted as in FIG. 13.

As described above, the first separation grooves 17c, the second separation grooves 19c, and the inorganic partition portion 50 form the moisture blocking structures 4 and 5. With this structure, the organic planarization film 17 and the pixel isolation film 19 are separated by the moisture blocking structures 4 and 5, and no film containing an organic material extends across the region of the moisture blocking structures 4 and 5. In other words, none of the films that extend across the region of the moisture blocking structures 4 and 5 contain an organic material. Therefore, moisture intrusion from the edge 2E of the display panel 2 to the display region 2A may be suppressed, and the moisture blocking property may be improved.

In the frame region 2C, circuit elements 40 containing TFTs, which are similar to the pixel circuits 30, are arranged below the inorganic partition portion 50. The circuit element 40 is a gate drive circuit, for example. The circuit element 40 includes a conductive film 36c in the same layer as the source electrodes 34 and the drain electrodes 36 of the pixel circuits 30. Moreover, wiring 47 that extends across the region of the moisture blocking structures 4 and 5 is arranged between the inorganic partition portion 50 and the interlayer insulating film 15. The wiring 47 is connected to the circuit elements 40. The wiring 47 is made of the conductive film 36c in the same layer as the source electrodes 34 and the drain electrodes 36 of the pixel circuits 30. The drain electrode 36 is an example of a lower electrode. The "same layer" as used herein refers to a layer formed at the same time and made of the same material.

In this embodiment, the inorganic partition portion 50 is provided in the moisture blocking structures 4 and 5, and the counter electrode 23 is arranged above the inorganic partition portion 50. Therefore, the conductive film 36c in the same layer as the source electrodes 34 and the drain electrodes 36 of the pixel circuits 30 may be arranged in the region of the moisture blocking structures 4 and 5 without any need to consider a short circuit with the counter electrode 23. With this structure, the circuit elements 40 and the wiring 47 using the conductive film 36 may be provided in the region of the moisture blocking structures 4 and 5. Moreover, the circuit elements 40 may be arranged in the region of the moisture blocking structures 4 and 5, and hence a contribution may be made toward narrowing the frame.

[Manufacturing Method]

Figure 3:
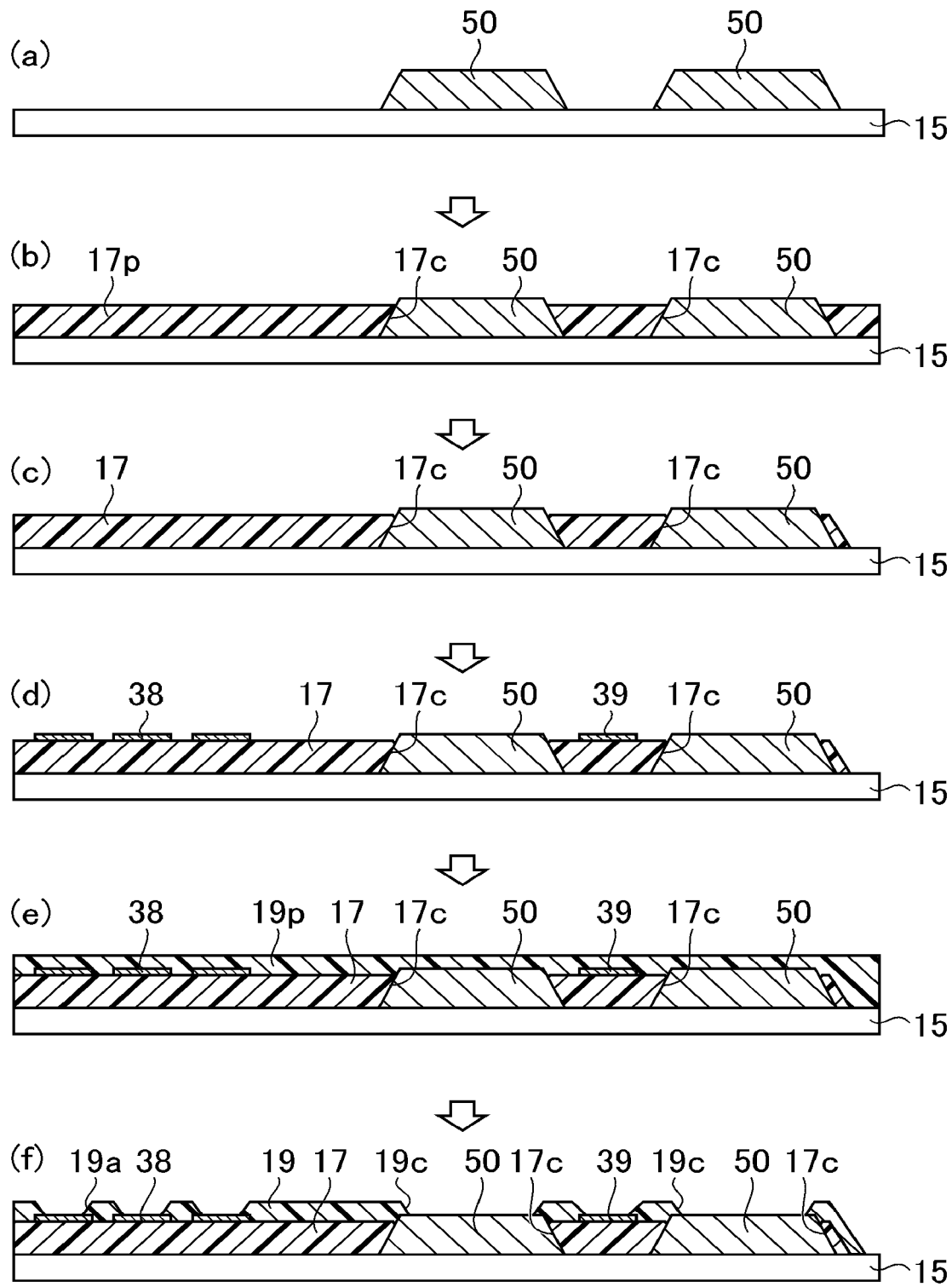
FIG. 3 is views for illustrating manufacturing steps of the above-mentioned display device.

FIG. 3 is views for illustrating a part of manufacturing steps of the display device 1. In the figure, the insulating film below the interlayer insulating film 15 and a part of the conductive films are omitted.

Ina step (a), the inorganic partition portion 50 is selectively formed above the interlayer insulating film 15. The selective formation of the inorganic partition portion 50 is realized by, for example, forming a coating film made of an inorganic material to cover the interlayer insulating film 15 by chemical vapor deposition (CVD), and patterning the coating film by a photoetching technology. The inorganic partition portion 50 is made of an inorganic material, e.g., silicon oxide or silicon nitride. The inorganic partition portion 50 has a thickness of about 2.2 µm, for example.

In a step (b), a coating film 17p, which is to form the organic planarization film 17 later, is formed above the interlayer insulating film 15. The formation of the coating film 17p is realized by a coating method, e.g., spin coating, and an upper surface of the coating film 17p is formed to be flat. Here, the coating film 17p is formed by the coating method under the state in which the inorganic partition portion 50 is formed, and hence the coating film 17p is formed to avoid the inorganic partition portion 50 so that an upper portion of the inorganic partition portion 50 projects from the upper surface of the coating film 17p. As a result, the first separation grooves 17c, which separate the coating film 17p in an in-plane direction, and are filled with the inorganic partition portion 50, are formed. In other words, an interface between the coating film 17p and the inorganic partition portion 50 forms the first separation groove 17c. The coating film 17p contains an organic material, e.g., an acrylic resin. The coating film 17p has a thickness of about 2 µm, for example.

The present invention is not limited to the above-mentioned method. For example, the first separation grooves 17c are formed in the coating film 17p, and then the inorganic partition portion 50 may be formed inside the first separation grooves 17c.

In a step (c), the coating film 17p is patterned by a photoetching technology to complete the organic planarization film 17. The organic planarization film 17 having a flat upper surface is formed to suppress the short circuit of the pixel electrode 38 and the counter electrode 23 due to a disconnection in the organic film 21 including the light emitting layer, and to prevent the disconnection of the organic film (see FIG. 2).

In a step (d), the pixel electrodes 38 and the conductive film 39 are selectively formed above the organic planarization film 17. The selective formation of the pixel electrodes 38 and the conductive film 39 is realized by, for example, forming a metal film to cover the organic planarization film 17 by sputtering or vapor deposition, and patterning the metal film by a photoetching technology. The pixel electrodes 38 and the conductive film 39 are made of metals, e.g., indium tin oxide (ITO), aluminum, silver, copper, nickel, and titanium. The pixel electrodes 38 and the conductive film 39 have a thickness of about 0.2 µm, for example.

In a step (e), a coating film 19p, which is to form the pixel isolation film 19 later, is formed above the organic planarization film 17, the inorganic partition portion 50, the pixel electrodes 38, and the conductive film 39. The formation of the coating film 19p is realized by a coating method, e.g., spin coating, and an upper surface of the coating film 19p is formed to be flat. The coating film 19p contains an organic material, e.g., an acrylic resin. The coating film 19p has a thickness of about 1 µm, for example.

In a step (f), the apertures 19a, which expose the pixel electrodes 38, and the second separation grooves 19c, which separate the coating film 19p, are formed in the coating film 19p at the same time to complete the pixel isolation film 19.

In this embodiment, the inorganic partition portion 50 is arranged in the first separation grooves 17c, and hence a portion of the coating film 19p that is formed above the inorganic partition portion 50 becomes thinner than in a case where the inorganic partition portion 50 is not arranged (see FIG. 4, which is to be described later). Therefore, even under etching conditions optimized to form the apertures 19a in the coating film 19p, reliability of removing the portion of the coating film 19p that is formed above the inorganic partition portion 50 may be improved, and the second separation grooves 19c with, if any, a very small residue. As a result, the moisture blocking property is improved.

It is preferred that the upper surface of the inorganic partition portion 50 is located above the upper surface of the organic planarization film 17 and below the upper surface of the pixel isolation film 19, and it is particularly preferred that the upper surface of the inorganic partition portion 50 is located at about the same height as the upper surface of the pixel electrodes 38. In this case, the portion of the coating film 19p that is formed above the inorganic partition portion 50 has about the same thickness as portions of the coating film 19p that are formed above the pixel electrodes 38. Therefore, the etching conditions optimized to form the apertures 19a in the coating film 19p are also optimized to form the second separation grooves 19c, and the reliability of removal is further improved.

REFERENCE EXAMPLE

Figure 4:
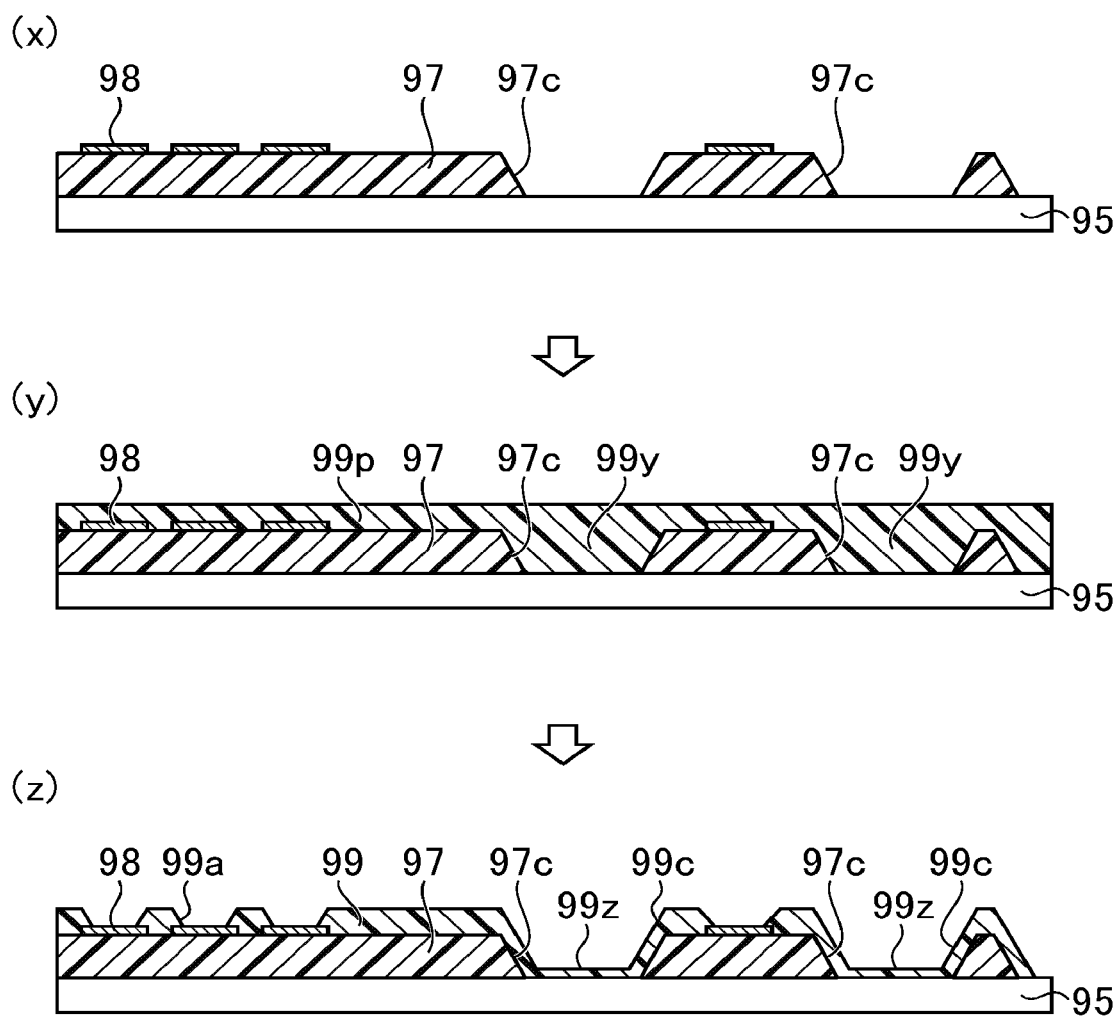
FIG. 4 is views for illustrating manufacturing steps of a display device according to a reference example.

FIG. 4 is views for illustrating manufacturing steps of a display device according to a reference example in which the above-mentioned inorganic partition portion 50 is not provided. In a step (x), first separation grooves 97c are formed in an organic planarization film 97, and pixel electrodes 98 are selectively formed above the organic planarization film 97. At the bottom of the first separation grooves 97c, an interlayer insulating film 95 is exposed.

In a step (y), a coating film 99p, which is to form a pixel isolation film 99 later, is formed above the organic planarization film 97 and the interlayer insulating film 95, which is exposed at the bottom of the first separation grooves 97c, by a coating method, e.g., spincoating. At this time, inside the first separation grooves 97c, a filling portion 99y, in which a material of the coating film 99p is filled in a large amount, is formed. The filling portion 99y becomes thicker than the portion of the coating film 99p that is formed above the pixel electrodes 98.

In a step (z), the coating film 99p is patterned by a photoetching technology to form apertures 99a, which expose the pixel electrodes 98, and second separation grooves 99c, which separate the coating film 99p. However, with the thick filling portion 99y existing inside the first separation grooves 97c, under etching conditions optimized to form the apertures 99a in the coating film 99p, there is a risk that the filling portion 99y cannot be removed completely to form a residue 99z, resulting in an insufficient moisture blocking property.

Second Embodiment

Figure 5:
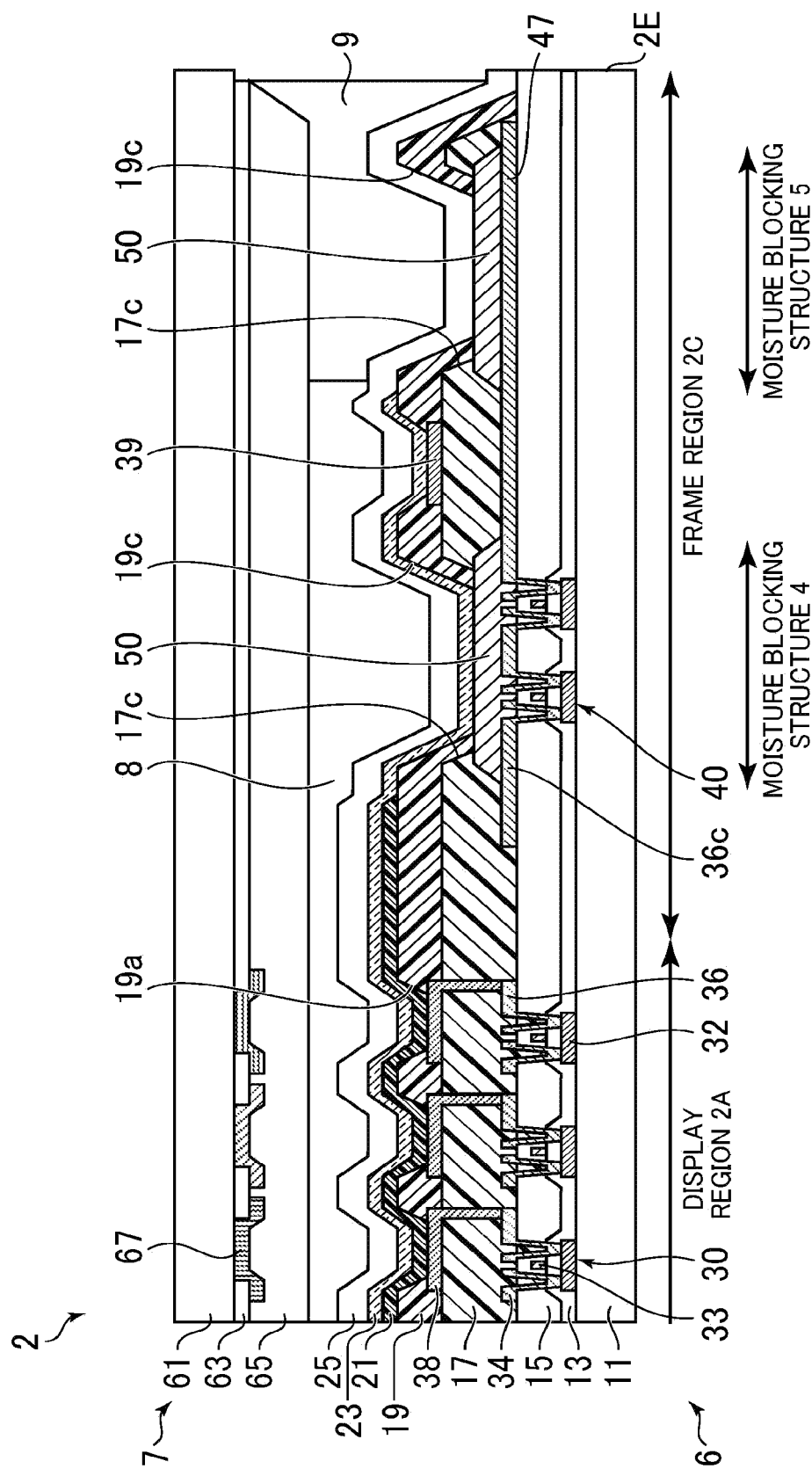
FIG. 5 is a sectional view of a display device according to a second embodiment of the present invention.

FIG. 5 is a sectional view of a display device according to a second embodiment of the present invention. In the moisture blocking structures 4 and 5 in the second embodiment, the upper surface of the inorganic partition portion 50 is located below the upper surface of the organic planarization film 17, and the second separation grooves 19c are located inside the first separation grooves 17c. The first separation grooves 17c are formed by, for example, first forming the inorganic partition portion 50, forming in this state a coating film, which covers the inorganic partition portion 50 and is to form the organic planarization film 17, and etching to remove a portion of the coating film that is formed above the inorganic partition portion 50. Therefore, the first separation groove 17c includes a lower portion in which the inorganic partition portion 50 is provided, and an upper portion formed by etching. The second separation groove 19c has its bottom at the upper surface of the inorganic partition portion 50, and an edge portion of the pixel isolation film 19 that forms the second separation groove 19c covers an inclined surface of the first separation groove 17c, and is in contact with the upper surface of the inorganic partition portion 50. The organic planarization film 17 has a thickness of about 2 μm, for example, and the inorganic partition portion 50 has a thickness of about 1.5 μm, for example.

Even with the upper surface of the inorganic partition portion 50 being located below the upper surface of the organic planarization film 17 as described above, when the pixel isolation film 19 is formed, the portion of the coating film, which is to form the pixel isolation film 19, that is formed above the inorganic partition portion 50 becomes thinner than when the inorganic partition portion 50 is not provided, and hence the reliability of removing the portion is improved, to thereby improve the moisture blocking property. Moreover, the time required to form the inorganic partition portion 50, for example, the time required to deposit the coating film, which is to form the inorganic partition portion 50, may be reduced than in the first embodiment. Therefore, both the moisture blocking property and productivity is achieved.

Third Embodiment

Figure 6:
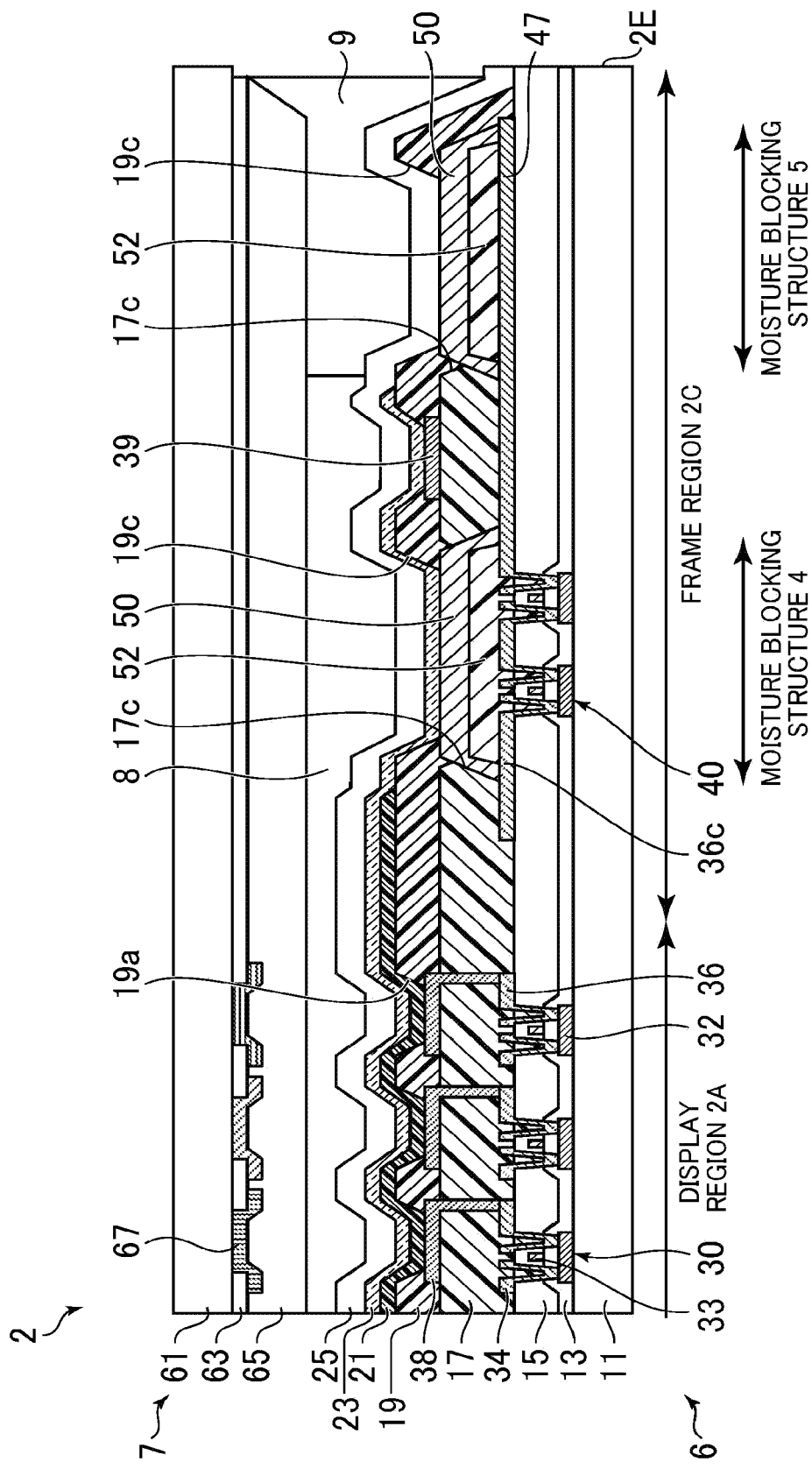
FIG. 6 is a sectional view of a display device according to a third embodiment of the present invention.

FIG. 6 is a sectional view of a display device according to a third embodiment of the present invent ion. In the moisture blocking structures 4 and 5 in the third embodiment, an organic base 52 is provided inside the inorganic partition portion 50. Specifically, the organic base 52 is provided above the interlayer insulating film 15, and the inorganic partition portion 50 is formed to cover the organic base 52. An upper surface and side surfaces of the organic base 52 are covered by the inorganic partition portion 50, and a lower surface of the organic base 52 is covered by the interlayer insulating film 15 and a conductive layer 36c. With such inorganic partition portion 50 in which the organic base 52 is provided inside, the moisture blocking structures 4 and 5 may be realized. Moreover, an organic material is easier to quickly form a thick coating film as compared to an inorganic material. Therefore, a reduction in time required for the formation is achieved by providing the organic base 52 in advance and forming the inorganic partition portion 50 to cover the organic base 52.

Fourth Embodiment

Figure 7:
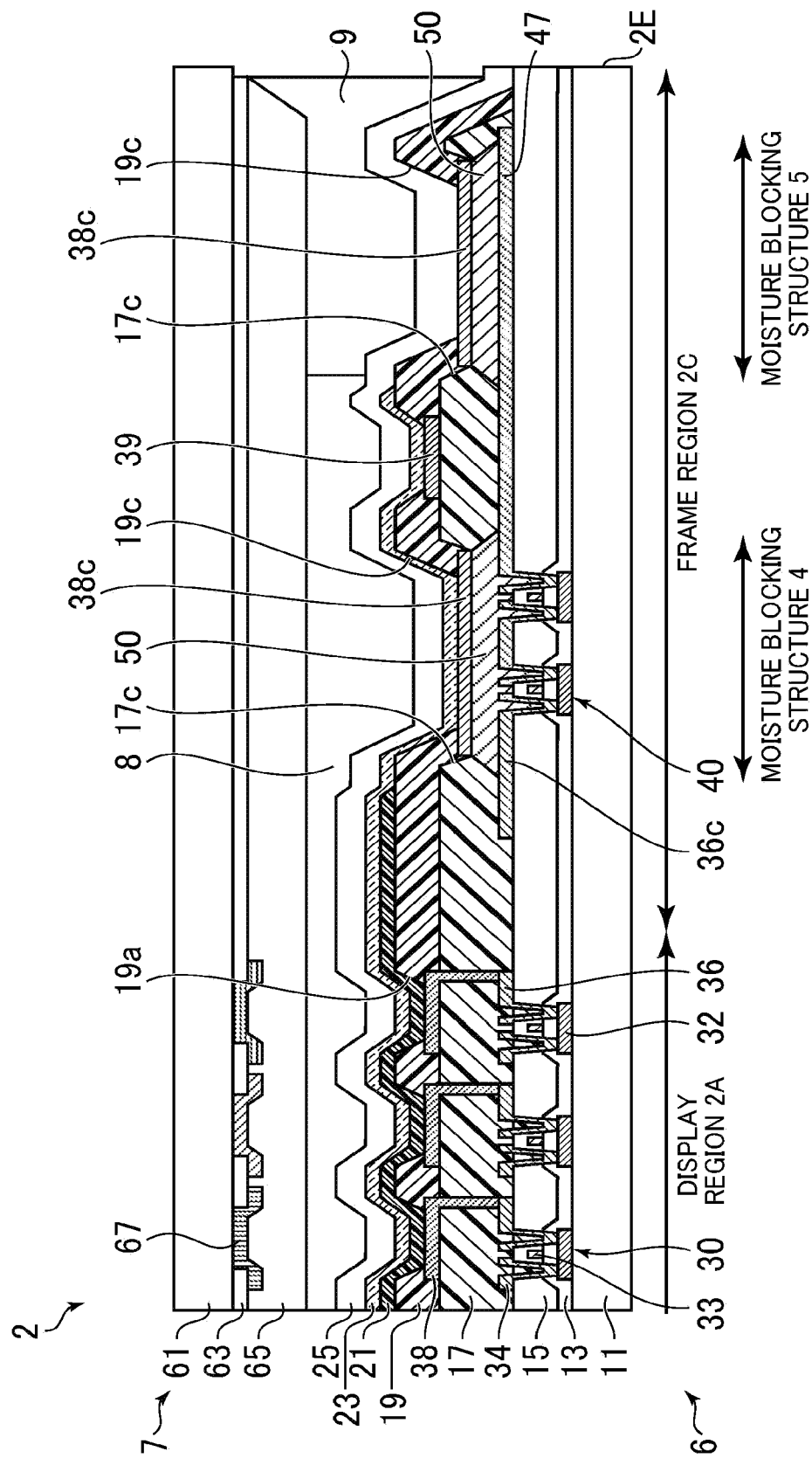
FIG. 7 is a sectional view of a display device according to a fourth embodiment of the present invention.

FIG. 7 is a sectional view of a display device according to a fourth embodiment of the present invention. In the moisture blocking structures 4 and 5 in the fourth embodiment, the conductive film 38c in the same layer as the pixel electrodes 38 is provided above the inorganic partition portion 50. The upper surface of the inorganic partition portion 50 is located below the upper surface of the organic planarization film 17, and the conductive film 38c is located inside the first separation grooves 17c. The upper surface of the conductive film 38c is located below the upper surface of the organic planarization film 17. However, the present invention is not limited thereto, and the upper surface of the conductive film 38c may be located above the upper surface of the organic planarization film 17. The second separation groove 19c has its bottom at the upper surface of the conductive film 38c, and an edge portion that forms the second separation groove 19c of the pixel isolation film 19 covers an inclined surface of the first separation groove 17c, and is in contact with the upper surface of the conductive film 38c. The conductive film 38c is electrically isolated from the pixel electrode 38.

With the conductive film 38c being provided above the inorganic partition portion 50 as described above, a total thickness of the inorganic partition portion 50 and the conductive film 38c is enough to improve the moisture blocking property. In other words, informing the pixel isolation film 19, a thickness of a portion of the coating film, which is to form the pixel isolation film 19, that is formed above the conductive film 38c becomes thinner than in the second embodiment. Therefore, the reliability of removing the portion may be further improved, and as a result, the moisture blocking property is improved.

Fifth Embodiment

Figure 8:
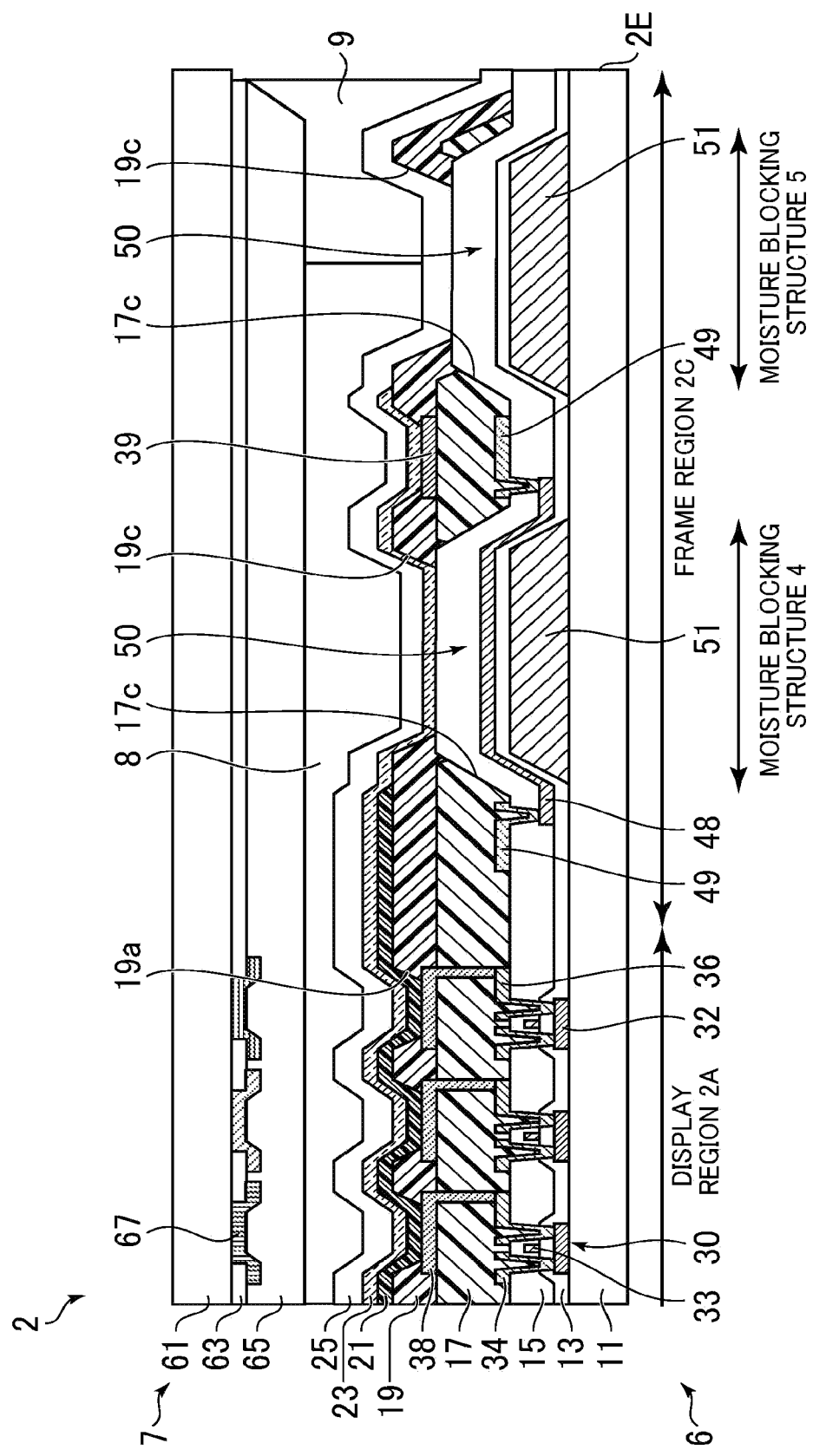
FIG. 8 is a sectional view of a display device according to a fifth embodiment of the present invention.

FIG. 8 is a sectional view of a display device according to a fifth embodiment of the present invention. In the moisture blocking structures 4 and 5 in the fifth embodiment, the inorganic partition portion 50 is formed utilizing the interlayer insulating film 15. In the example illustrated in the figure, an inorganic base 51 is provided above the substrate 11, and the interlayer insulating films 13 and 15 are laminated above the inorganic base 51 to form the inorganic partition portion 50 having the upper surface and the side surfaces that are made of the interlayer insulating film 15. The inorganic base 51 is made of an inorganic material, e.g., silicon oxide or silicon nitride. With such inorganic partition portion 50 formed utilizing the interlayer insulating film 15, the moisture blocking property is improved.

Incidentally, in the fifth embodiment, the upper surface of the interlayer insulating film 15 forming the inorganic partition portion 50 forms the bottom of the second separation grooves 19c. In this case, when the wiring 47 (see FIG. 2 etc.) in the same layer as the source electrodes 34 and the drain electrodes 36 of the pixel circuits 30 is formed on an upper surface of the interlayer insulating film 15 forming the inorganic partition portion 50, a short circuit with the counter electrode 23 becomes a problem. Therefore, in the fifth embodiment, in the region of the moisture blocking structures 4 and 5, wiring 48 in the same layer as the gate electrodes 33 of the pixel circuits 30 is utilized. Specifically, in regions other than the moisture blocking structures 4 and 5 of the frame region 2C, wiring 49 in the same layer as the source electrodes 34 and the drain electrodes 36 of the pixel circuits 30 is provided, and in the region of the moisture blocking structures 4 and 5, the wiring 48 in the same layer as the gate electrodes 33 of the pixel circuits 30, which is connected to the wiring 49 via interlayer connection holes formed in the interlayer insulating film 15, is provided between the interlayer insulating films 13 and 15.

Sixth Embodiment

Figure 9:
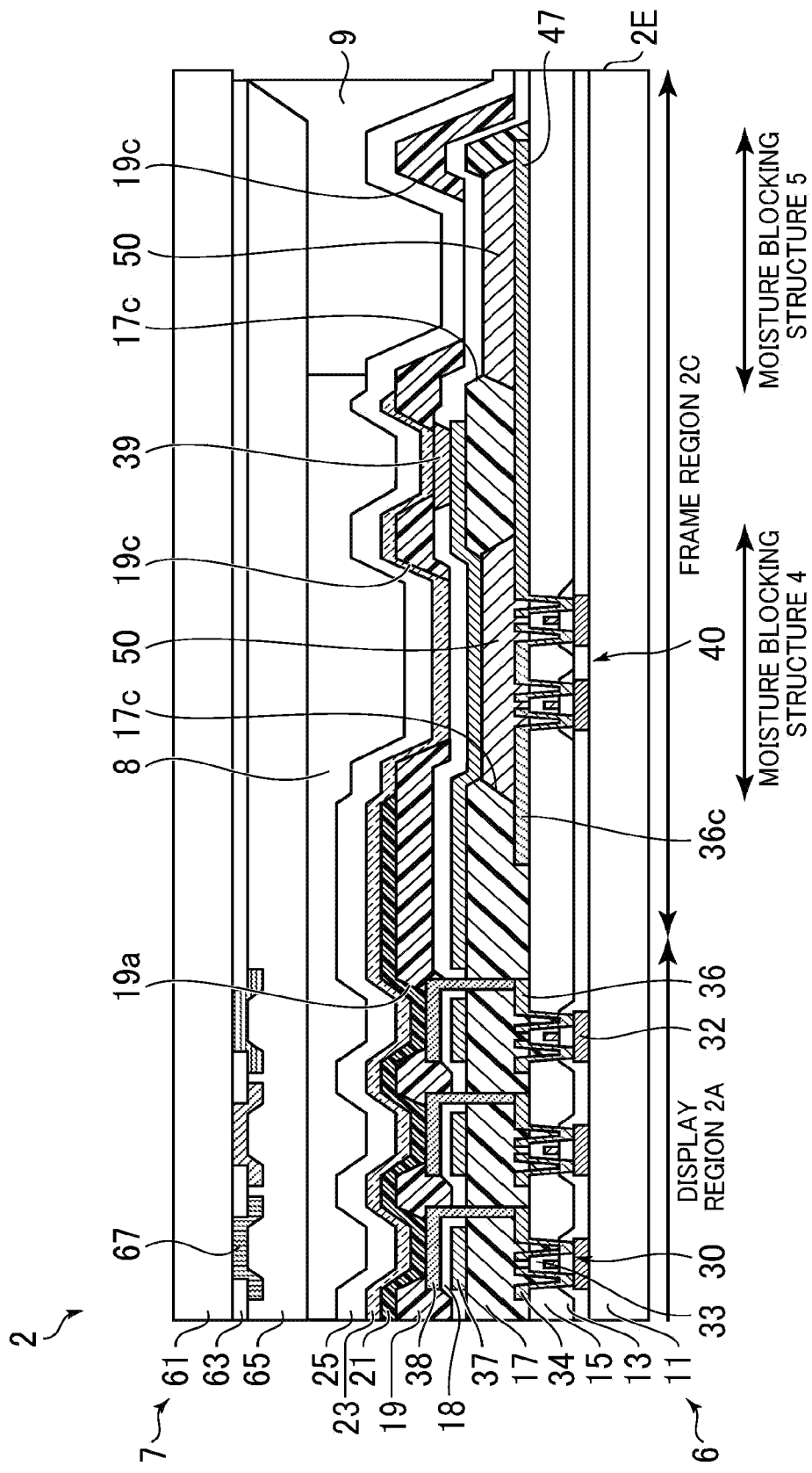
FIG. 9 is a sectional view of a display device according to a sixth embodiment of the present invention.

FIG. 9 is a sectional view of a display device according to a sixth embodiment of the present invention. In the sixth embodiment, the interlayer insulating film 18 is provided between the organic planarization film 17 and the pixel isolation film 19, and capacitance forming electrodes 37, which are opposed to the pixel electrodes 38 with the interlayer insulating film 18 being interposed between the capacitance forming electrodes 37 and the pixel electrodes 38, are arranged between the organic planarization film 17 and the interlayer insulating film 18. The interlayer insulating film 18 is an inorganic insulating film made of an inorganic material, e.g., silicon oxide or silicon nitride. The capacitance forming electrodes 37 are each made of a metal, e.g., aluminum, silver, copper, nickel, or titanium.

The interlayer insulating film 18 and the capacitance forming electrodes 37 extend also to the frame region 2C. The interlayer insulating film 18 extends over the entire frame region 2C, and the capacitance forming electrodes 37 extend past the moisture blocking structure 4 on the inside and to between the moisture blocking structure 4 on the inside and the moisture blocking structure 5 on the outside, for example. As a result, the interlayer insulating film 18 and the capacitance forming electrode 37 are provided above the inorganic partition portion 50 in the moisture blocking structure 4 on the inside, and the interlayer insulating film 18 is provided above the inorganic partition portion 50 in the moisture blocking structure 5 on the outside. The second separation groove 19c has its bottom at a portion of the interlayer insulating film 18 that is formed above the inorganic partition portion 50, for example. Moreover, the capacitance forming electrode 37 is connected to the counter electrode 23 via the conductive film 39 between the moisture blocking structure 4 on the inside and the moisture blocking structure 5 on the outside so that the capacitance forming electrode 37 and the counter electrode 23 have the same potential.

Even when at least one of the interlayer insulating film 18 and the capacitance forming electrode 37 is provided above the inorganic partition portion 50 as described above, the moisture blocking property is improved. Further, with the interlayer insulating film 18 and the capacitance forming electrode 37 being provided above the inorganic partition portion 50 as described above, a total thickness of the inorganic partition portion 50, the interlayer insulating film 18, and the capacitance forming electrode 37 is enough to improve the moisture blocking property. In other words, in forming the pixel isolation film 19, a thickness of a portion of the coating film, which is to form the pixel isolation film 19, that is formed above the interlayer insulating film 18 becomes thinner than in the second embodiment. Therefore, the reliability of removing the portion is further improved, and as a result, the moisture blocking property is improved.

Seventh Embodiment

Figure 10:
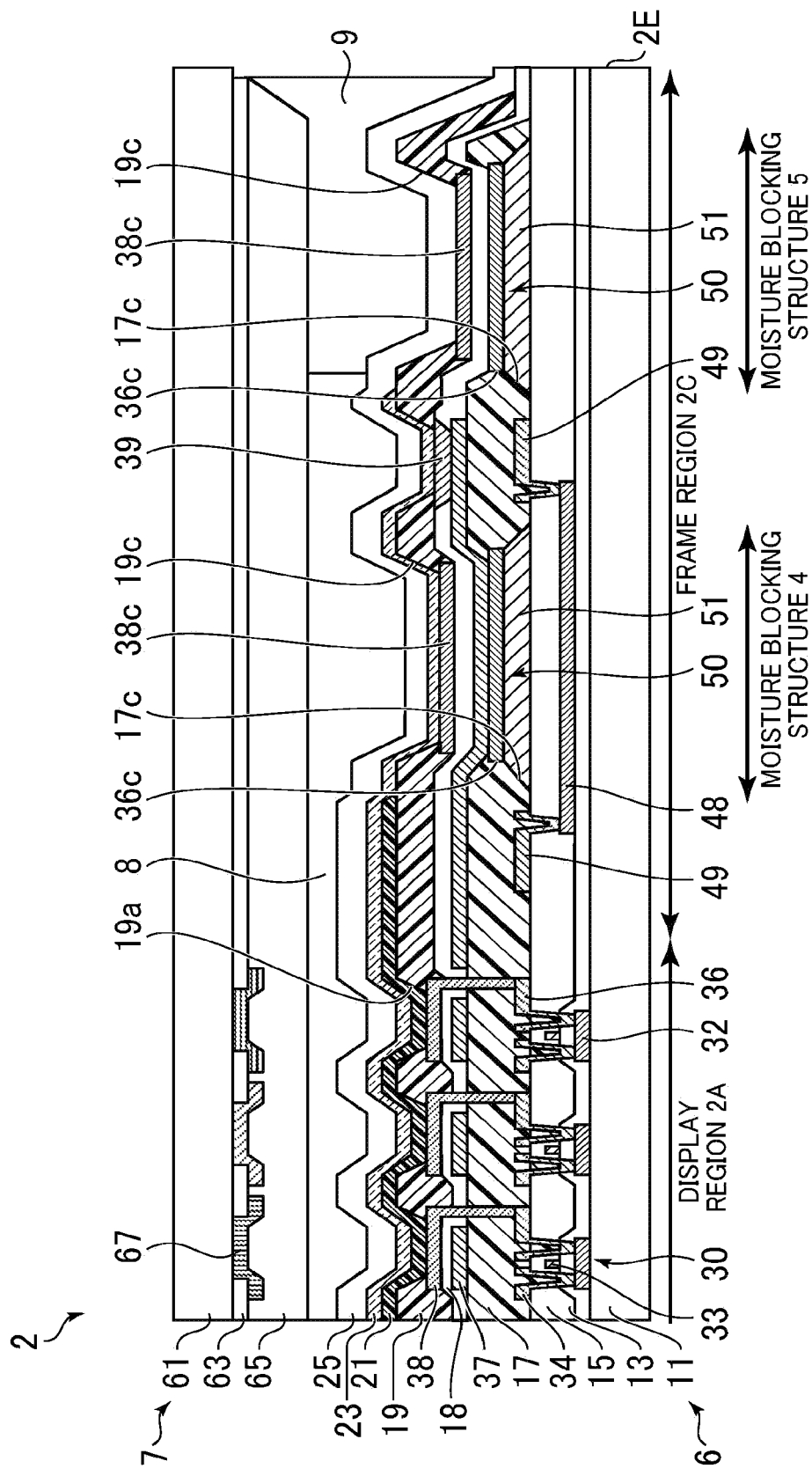
FIG. 10 is a sectional view of a display device according to a seventh embodiment of the present invention.

FIG. 10 is a sectional view of a display device according to a seventh embodiment of the present invention. In the moisture blocking structures 4 and 5 in the seventh embodiment, the inorganic partition portion 50 includes the inorganic base 51 and the conductive film 36c, and the capacitance forming electrode 37, the interlayer insulating film 18, and the conductive film 38c are arranged above the inorganic partition portion 50. The second separation groove 19c has its bottom at the upper surface of the conductive film 38c. The inorganic base 51, the conductive film 36c, the capacitance forming electrode 37, the interlayer insulating film 18, and the conductive film 38c are utilized as described above to secure a total thickness thereof, and to improve the moisture blocking property. In other words, in forming the pixel isolation film 19, a thickness of a portion, which is formed above the conductive film 38c, of the coating film, which is to form the pixel isolation film 19, becomes thinner than in the second embodiment. Therefore, the reliability of removing the portion is further improved, and as a result, the moisture blocking property may be improved.

MODIFIED EXAMPLE

The above-mentioned sixth embodiment (see FIG. 9) may be applied to a display device having the sectional structure illustrated in FIG. 11. In this modified example, the TFTs of the pixel circuits 30 arranged in the display region 2A are N-channel (Nch) TFTs, for example, and the circuit elements 40, e.g., the gate drive circuits, arranged in the frame region 2C are P-channel (Pch) TFTs, for example. In the Nch TFT, a low-density impurity region is provided between a channel region opposed to the gate electrode 33 of the semiconductor film 32, and a connection region in which the source electrode 34 and the drain electrode 36 are connected to each other. Also in the Pch TFT, a low-density impurity region is provided between a channel region opposed to the gate electrode 43 of the semiconductor film 42 and the connection region in which the source electrode 44 and the drain electrode 46 are connected to each other.

An extending portion of the gate electrode 33 of the pixel circuit 30 forms a storage capacitor line, and forms a storage capacitor with the semiconductor film 32. Moreover, the extending portion of the gate electrode 33 also forms a storage capacitor with an extending portion of the drain electrode 36. The conductive layer including the gate electrodes 33 and 43 has the laminate structure in which aluminum and titanium are laminated, for example. The conductive layer including the source electrodes 34 and 44 and the drain electrodes 36 and 46 has the laminate structure in which titanium, aluminum, and titanium are laminated in the stated order, for example. The wiring formed of the conductive layer including the source electrodes 34 and 44 and the drain electrodes 36 and 46 is routed to a terminal portion provided in an end portion of the array substrate 6 to form a terminal 70.

In portions of the conductive layer including the source electrodes 34 and 44 and the drain electrodes 36 and 46 that are exposed by removing the organic planarization film 17 and other such portions, conductive films 381, 382, and 383 are formed made of a transparent conductive material, e.g., ITO. Specifically, the conductive film 381 is formed in an interlayer connection hole formed in the organic planarization film 17 to expose the drain electrode 36 in the display region 2A. Further, an interlayer connection hole is also formed in the interlayer insulating film 18, which fills the interlayer connection hole in the organic planarization film 17, and allows the pixel electrode 38 to be connected to the conductive film 381. The conductive film 382 is formed on the upper surface of the organic planarization film 17 in the frame region 2C to connect the capacitance forming electrode 37 and the counter electrode 23 to each other. In other words, the conductive film 382 is connected to the capacitance forming electrode 37, which is also arranged between the organic planarization film 17 and the pixel isolation film 19, and is also connected to the counter electrode 23 via the interlayer connection hole formed in the pixel isolation film 19. The terminal 70 in the terminal portion is covered by the conductive film 383.

The capacitance forming electrode 37 has the laminate structure in which molybdenum, aluminum, and molybdenum are laminated in the stated order, for example. The pixel electrode 38 has the laminate structure in which ITO, silver, and ITO are laminated in the stated order, for example.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device comprising:
a display region in which pixels are arranged and a frame region surrounding the display region;
a first organic insulating film provided on the display region and the frame region;
a second organic insulating film provided on the first organic insulating film in the display region and the frame region;
an inner groove penetrating the first organic insulating film and the second organic insulating film;
an outer groove being farther from the display region than the inner groove and penetrating the second organic insulating film;
a circuit element or a wiring provided at a bottom of the inner groove;
a mid-bank portion between the inner groove and the outer groove including part of the first organic insulating film and part of the second organic insulating film; and
a covering member provided in the display region and the frame region, an edge of the covering member placed above an area between the inner groove and the outer groove, wherein
the inner groove and the outer groove extend along the display region, and
the second organic insulating film covers an edge of the first organic insulating film.
2. The display device according to claim 1, wherein
in the inner groove, an inclination angle of a lower edge of the first organic insulating film is different from an inclination angle of an edge of the second organic insulating film.
3. The display device according to claim 1, wherein
in the inner groove, an inclination angle of a lower edge of the first organic insulating film is obtuse, while an inclination angle of an edge of the second organic insulating film is acute.
4. The display device according to claim 1, wherein
the circuit element or the wiring is covered by a third organic insulating layer.
5. The display device according to claim 4, wherein
the third organic insulating layer is covered by an inorganic insulating layer.
6. The display device according to claim 1, wherein
the outer groove extends along the inner groove.

7. The display device according to claim 1, wherein
the covering member has a shape with at least four sides and without an opening, and the at least four sides are located in the frame region.
8. The display device according to claim 1, further comprising:
a sealing member provided on the first organic insulating film, wherein
the sealing member overlaps the outer groove.
9. The display device according to claim 8, wherein
an edge of the sealing member surrounds the covering member, and the covering member adheres to the sealing member and fills an area surrounded by the sealing member.
10. The display device according to claim 1, wherein
an inorganic layer covers the first organic insulating film and the second organic insulating film in which the inner groove and the outer groove are formed.
11. The display device according to claim 10, wherein
the inorganic layer is provided beneath the covering member.
12. The display device according to claim 10, wherein
the inorganic layer is provided between the second organic insulating film and the covering member to prevent direct contact between the covering member and the second organic insulating film.
13. The display device according to claim 1, further comprising:
a plurality of pixel electrodes provided on the display region; and
a common electrode provided on the display region and the frame region, wherein
the common electrode at least covers the inner groove and contacts a conductive film at the area between the inner groove and the outer groove.
14. The display device according to claim 13, wherein
the conductive film is provided on the first organic insulating film, and the covering member covers the line.
15. A display device comprising:
a display region in which pixels are arranged and a frame region surrounding the display region;
a first organic insulating film provided on the display region and the frame region;
a second organic insulating film provided on the first organic insulating film in the display region and the frame region;
an inner groove penetrating the first organic insulating film and the second organic insulating film;
an outer groove being farther from the display region than the inner groove and penetrating the second organic insulating film;
a mid-bank portion between the inner groove and the outer groove including part of the first organic insulating film and part of the second organic insulating film;
a middle groove penetrating the second organic insulating film provided at the mid-bank portion;
a wiring provided at a bottom of the middle groove; and
a covering member provided in the display region and the frame region, an edge of the covering member placed above an area between the inner groove and the outer groove, wherein
the inner groove and the outer groove extend along the display region, and
the second organic insulating film covers an edge of the first organic insulating film.
16. A display device comprising:
a display region in which pixels are arranged and a frame region surrounding the display region;

a first organic insulating film provided on the display region and the frame region;

a second organic insulating film provided on the first organic insulating film in the display region and the frame region;

an inner groove penetrating the first organic insulating film and the second organic insulating film;

an outer groove being farther from the display region than the inner groove and penetrating the second organic insulating film;

a wiring provided at a bottom of the outer groove;

a mid-bank portion between the inner groove and the outer groove including part of the first organic insulating film and part of the second organic insulating film; and a covering member provided in the display region and the frame region, an edge of the covering member placed above an area between the inner groove and the outer groove, wherein the inner groove and the outer groove extend along the display region, and the second organic insulating film covers an edge of the first organic insulating film.

17. The display device according to claim 16, further comprising:

a third organic insulating layer overlapping the wiring in the outer groove.

18. The display device according to claim 17, wherein the third organic insulating layer is covered by an inorganic insulating layer.

* * * * *